United States Patent
Takekoshi

(10) Patent No.: US 6,501,289 B1
(45) Date of Patent: *Dec. 31, 2002

(54) INSPECTION STAGE INCLUDING A PLURALITY OF Z SHAFTS, AND INSPECTION APPARATUS

(75) Inventor: Kiyoshi Takekoshi, Nishiyatsushiro-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/521,898

(22) Filed: Mar. 9, 2000

(30) Foreign Application Priority Data

Mar. 11, 1999 (JP) .............................. 11-064997

(51) Int. Cl.[7] .............................................. G01R 31/02
(52) U.S. Cl. .................................... 324/758; 324/158.1
(58) Field of Search ............................... 324/755, 758, 324/765, 73.1, 158.1; 33/533; 356/400, 401; 269/47, 73, 74, 320

(56) References Cited

U.S. PATENT DOCUMENTS

| 4,751,457 A | 6/1988 | Veenendaal |
| 4,934,064 A | 6/1990 | Yamaguchi et al. |
| 5,410,259 A | 4/1995 | Fujihara et al. |
| 5,436,571 A | 7/1995 | Karasawa |
| 5,642,056 A | * 6/1997 | Nakajima et al. ........... 324/758 |
| 5,773,987 A | 6/1998 | Montoya |
| 5,777,485 A | 7/1998 | Tanaka et al. |
| 5,872,458 A | 2/1999 | Boardman et al. |
| 6,037,793 A | 3/2000 | Miyazawa et al. |

FOREIGN PATENT DOCUMENTS

| JP | 4-207047 | 7/1992 |
| JP | 5-144892 | 6/1993 |

* cited by examiner

Primary Examiner—Vinh P. Nguyen
(74) Attorney, Agent, or Firm—Oblon, Spivak, McClelland, Maier & Neustadt, P.C.

(57) ABSTRACT

An inspection stage has the following a chuck top on which an object to be examined is mounted, a Z base for which the chuck top is provided and which is vertically movable, an X stage which supports the Z base to be vertically movable and which is movable in an X direction, and a Y stage which supports the X stage to be movable in the X direction and which is movable in a Y direction. The Z base is held and supported by three Z shaft lift mechanisms and is vertically movable. The inspection stage is applicable to an inspection stage.

11 Claims, 4 Drawing Sheets

INSPECTION STAGE INCLUDING A PLURALITY OF Z SHAFTS, AND INSPECTION APPARATUS

CROSS-REFERENCE TO RELATED APPLICATION

This application is based upon and claims the benefit of priority from the prior Japanese Patent Application No. 11-064997, filed Mar. 11, 1999, the entire contents of which are incorporated herein by reference.

BACKGROUND OF THE INVENTION

The present invention relates to an inspection stage on which an object to be inspected is mounted and an inspection apparatus provided with that inspection stage. More specifically, the present invention relates to an inspection stage that does not slant even when a chuck top on which the object is placed is exerted with an offset load during inspection.

Conventionally, a probe apparatus is employed as an inspection apparatus for inspecting an object such as a semiconductor wafer. The probe apparatus is provided with a loader chamber for conveying a wafer and pre-aligning it, and a prober chamber for receiving the wafer from the loader chamber and inspecting the electrical characteristics of the wafer. Inside the prober chamber, an inspection stage is provided. The inspection stage is adapted to hold a wafer mounted thereon, and is movable in the X, Y and Z directions. A probe card is arranged above the inspection stage. With the inspection stage moved, the object to be inspected is positioned with reference to the probe card. Then, the object and the probe card are electrically connected to each other. The probe card is connected to a measuring apparatus, by which the electric characteristics of the wafer are inspected.

An example of a conventional inspection stage is shown in FIG. 5. As shown in this Figure, the inspection stage comprises a chuck top 1 on which a wafer is mounted, a Z shaft 2 (e.g., a ball screw) extending downward from the center of the rear side of the chuck top 1, a Z shaft guide 3 for guiding the vertical movement of the Z shaft 2, and a vertical driving mechanism 4 for moving the chuck top 1 up or down along the Z shaft guide 3. The inspection stage is movable in the X and Y directions and positions the object with reference to the probe card. After the positioning, the chuck top 1 is moved up in the Z direction, thereby permitting the object W to come into contact with a probe card (not shown in FIG. 5).

In recent years, IC chips are integrated at higher density than before. Hence, an object to be examined has a large number of electrode pads, and these are arranged at very short pitches. The probe card has an increased number of contact terminals, accordingly. In addition, the number of objects that are measured at a time is also large. This being so, the load that the contact terminals apply to both objects and a main chuck when they are brought into contact with each other, has increased to a value which is between dozens of kg and 100 kg. When, as shown in FIG. 5, a peripheral portion of the object is inspected, the load P exerted to that peripheral portion is between dozens of kg and 100 kg, and the Z shaft guide 2 leans to one side, due to the insufficient rigidity of the Z shaft guide. As a result, the chuck top slants, with the Z shaft-driving mechanism 4 as a center of the slanting movement, as indicated by the broken lines in FIG. 5. If this occurs, the object and the probe card are not brought into uniform contact with each other. Since there are some contact terminals that fail to come into contact with the probe card, the reliability of the inspection is degraded.

Due to the above-noted load exerted during inspection, the Z shaft 2 may move through the Z shaft guide 3 in a slanted state. If this happens, the Z shaft guide 3 is damaged.

To prevent the chuck top from slanting, it may be thought to employ a long Z shaft guide 3 or to increase the number of balls. These measures, however, do not solve the problem stemming from the insufficient rigidity of the guide shaft 3.

As shown in FIG. 6, it is possible to employ a Z shaft 2A having a large diameter. As shown in FIG. 7, it is also possible to employ a plurality of Z shafts 2B. The former method is useful in improving the rigidity of the Z axis 2A, and the latter method is useful in reducing to the load applied to one Z shaft. Even if these measures are taken, however, the chuck top 1 is exerted with an offset load whose center lies in the vertical driving mechanism 4. This means that the above measures are insufficient to solve the slanting of the chuck top 1. In addition, the inspection stage and the inspection apparatus are inevitably large in size.

BRIEF SUMMARY OF THE INVENTION

The present invention has been developed in consideration of the above problems.

Accordingly, an object of the present invention is to prevent a chuck top from being slanted even if the number of contact terminals provided for a probe card is large, and the number of objects to be examined at a time is large, accordingly. The present invention is therefore intended to provide an inspection stage and an inspection apparatus that ensures high inspection reliability.

According to one aspect of the present invention, there is provided an inspection stage comprising:

a main chuck on which an object to be examined is mounted;

a support table for supporting the main chuck;

a support table lift mechanism including a plurality of Z shafts for supporting the support table, and a Z shaft vertical drive mechanism for vertically driving the Z shafts;

an X stage on which the support table lift mechanism is mounted and which is movable in an X direction; and a Y stage which supports the X stage and being movable in a Y direction.

In the inspection stage, it is preferable that the support table lift mechanism include a vertical position control device for controlling vertical positions of the Z shafts individually.

In the inspection stage, it is also preferable that the support table lift mechanism be located on an outer side of the main chuck.

In the inspection stage, it is further preferable that the vertical position control device include a slant detection mechanism 27 for detecting the degree of horizontality of the support table. On the basis of the degree of horizontality of the support table detected by the slant detection means, the vertical position control device controls the vertical positions of the Z shaft so as to keep the degree of horizontality of the support table within a predetermined range.

According to another aspect of the present invention, there is provided an inspection apparatus comprising:

a loader chamber in which a plurality of objects to be examined are received;

a prober chamber for inspecting the objects fed from the loader chamber; and an inspection stage arranged inside the prober chamber, the inspecting stage including:
a main chuck on which an object to be examined is mounted;
a support table for supporting the main chuck;
a support table lift mechanism including a plurality of Z shafts for supporting the support table, and a Z shaft vertical drive mechanism for vertically driving the Z shafts;
an X stage on which the support table lift mechanism is mounted and which is movable in an X direction; and
a Y stage which supports the X stage and being movable in a Y direction.

In the inspection stage, it is preferable that the support table lift mechanism include a vertical position control device for controlling vertical positions of the Z shafts individually.

In the inspection stage, it is further preferable that the vertical position control device include a slant detection mechanism 27 for detecting horizontality of the support table. On the basis of the degree of horizontality of the support table detected by the slant detection means, the vertical position control device controls the vertical positions of the Z shaft so as to keep the degree of horizontality of the support table within a predetermined range.

According to the third aspect of the present invention, there is provided an inspection stage comprising:
a main chuck on which an object to be examined is mounted;
a support table for supporting the main chuck;
a support table lift mechanism including three Z shafts for supporting the support table, a Z shaft vertical drive mechanism for vertically driving each of the Z shafts, and a vertical position control device for controlling the vertical position of each Z shaft, the vertical position control device having a linear sensor for detecting a position of the support table, and another linear sensor for detecting the degree of horizontality of the support table;
an X stage on which the support table lift mechanism is mounted and which is movable in an X direction; and
a Y stage which supports the X stage and being movable in a Y direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will now be described, referring to the embodiments shown in FIGS. 1 to 4.

Figure 1:
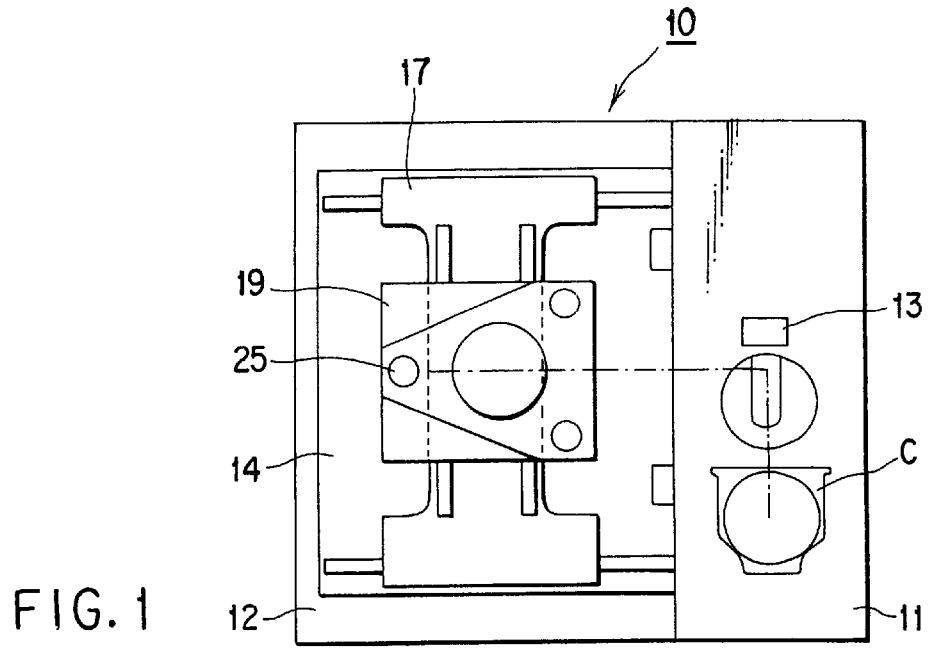
FIG. 1 is a plan view showing an inspection apparatus according to an embodiment, the inspection apparatus incorporating an inspection stage according to an embodiment.

FIG. 1 shows an inspection apparatus 10 according to an embodiment of the present invention. The inspection apparatus 10 comprises a loader chamber 11 for conveying a wafer W and executing pre-alignment of the wafer W; and a prober chamber 12 located adjacent to the loader chamber 11 and used for testing the electric characteristics of the wafer W. The loader chamber 11 is provided with: a carrier storage section for storing a carrier C that accommodates a predetermined number of wafers W (e.g., 25 wafers); tweezers 13 used for transferring a wafer W between the carrier C and the prober chamber 12; and a pre-alignment mechanism (not shown) for performing pre-alignment of the wafer W during the transfer operation. The prober chamber 12 is provided with an inspection stage 14 on which a wafer W is mounted and which is movable in X, Y and z directions; a probe card (not shown) secured at a position above the inspection stage 14; and an alignment mechanism (not shown) for aligning the wafer W and the probe card with reference to each other in cooperation with the inspection stage 14.

Figure 2:
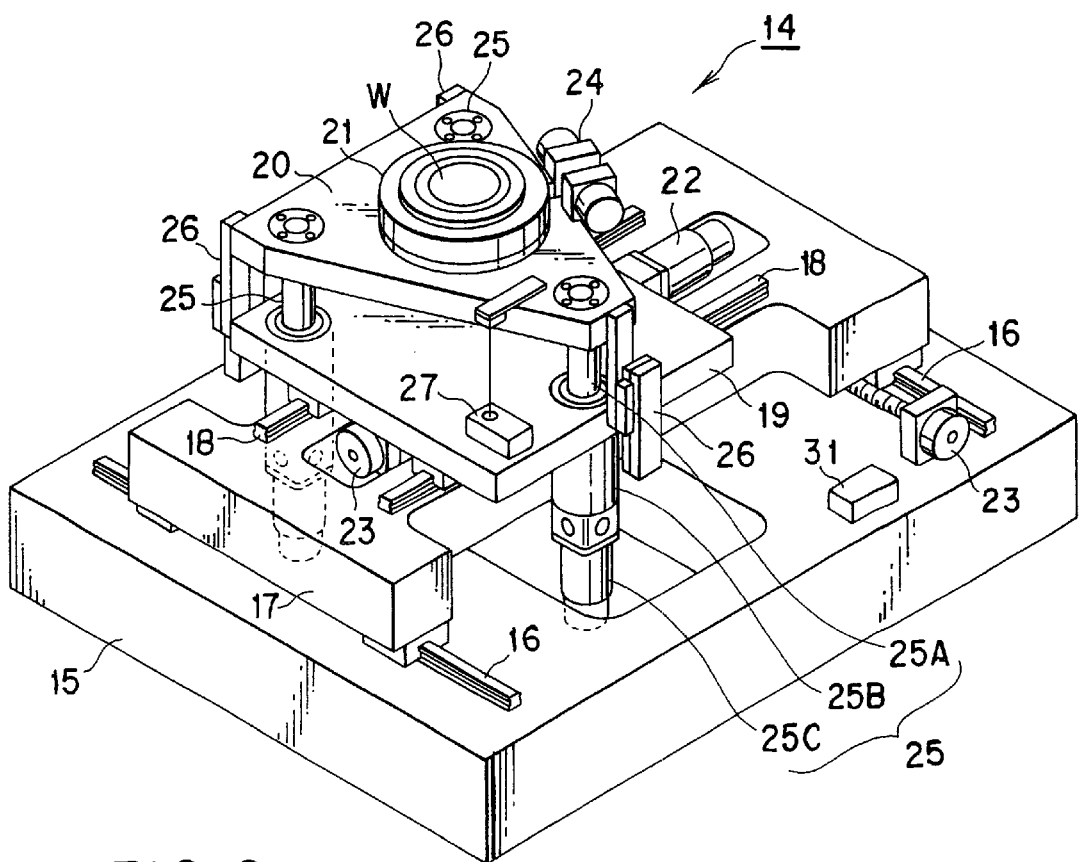
FIG. 2 is an enlarged perspective view showing the inspection stage depicted in FIG. 1.

As shown in FIGS. 1 and 2, the inspection stage 14 of the embodiment comprises the following: a base member 15; a pair of Y guide rails 16 provided on the base member 15; a Y stage 17 movable in the Y direction along the guide rails 16; a pair of X guide rails 18 provided on the Y stage 17; an X stage 19 movable in the X direction along the X guide rails 18; a substantially triangular support table 20 (hereinafter referred to as a "Z base") arranged above the X stage 19; a mount table 21 (hereinafter referred to as a "chuck top") located in the center of the Z base 20; an X-Y driving mechanism 22 for driving the X and Y stages 19 and 17; an encoder 23 for detecting the amounts of movement of the X and Y stages 19 and 17; and a θ driving mechanism 24, arranged on the Z base 20 and located on the side of the chuck top 21, for rotating the chuck top 21 in normal and reverse directions. By cooperating with the alignment mechanism under the control of a control device, the inspection stage 14 drives the X stage 19, the Y stage 17 and the θ driving mechanism 24, thereby aligning the wafer W on the chuck top 21 with the probe card.

Figure 3A:
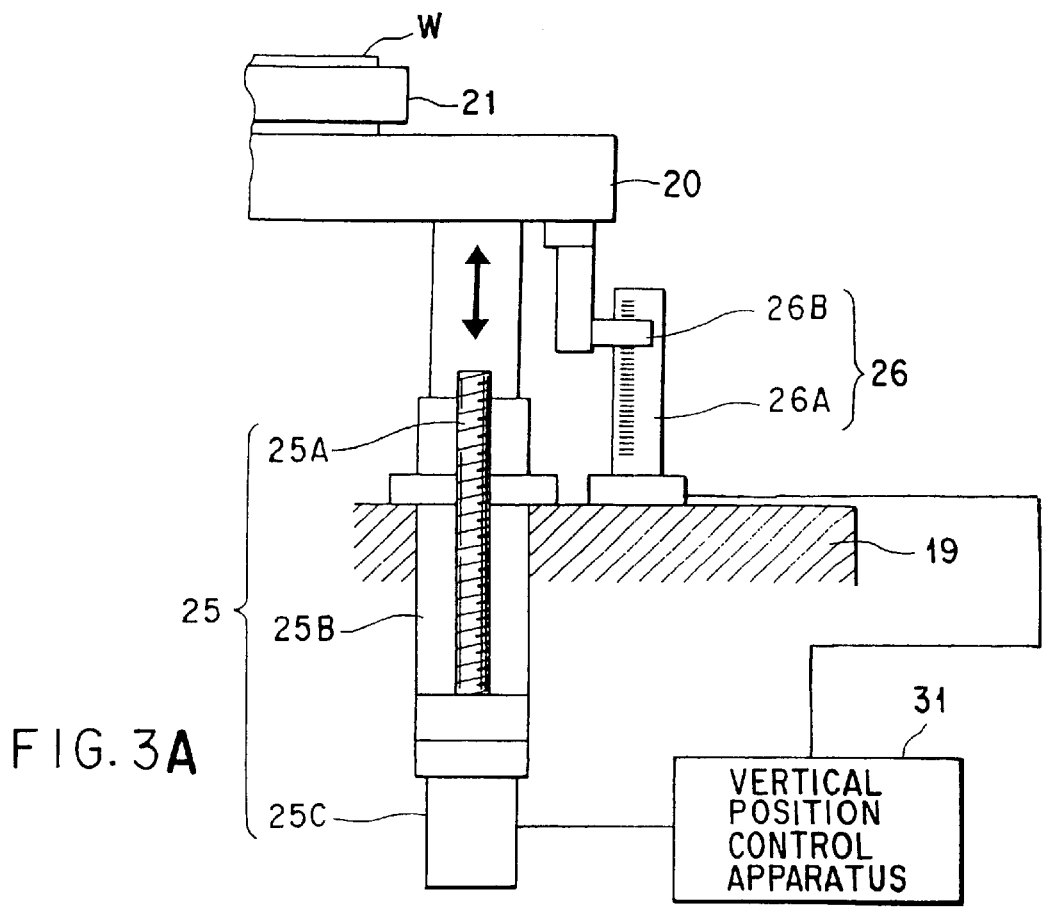
FIGS. 3A and 3B are diagrammatic illustrations of a linear sensor employed in the inspection stage shown in FIG. 2.
Figure 3B:
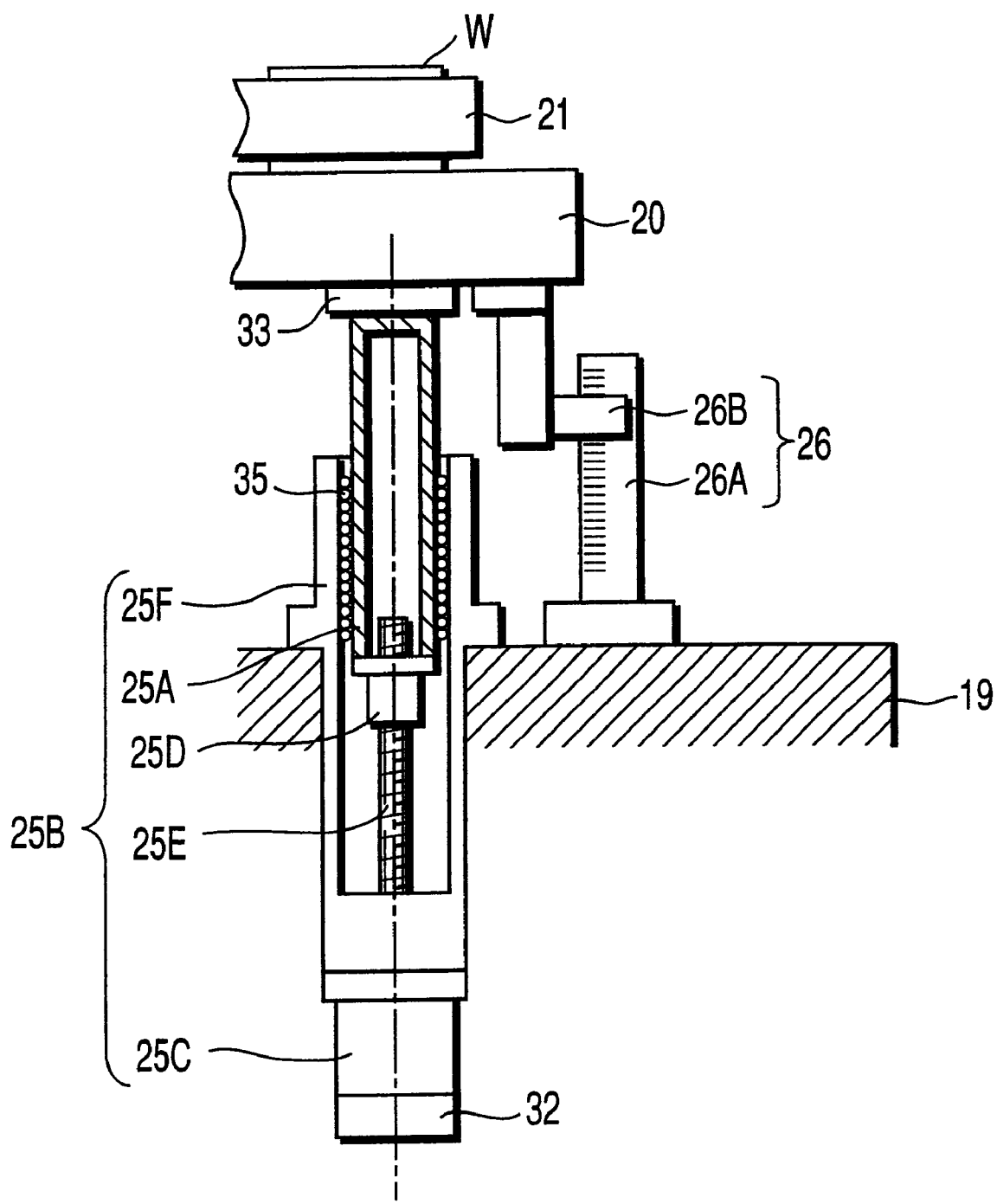
Figure 5:
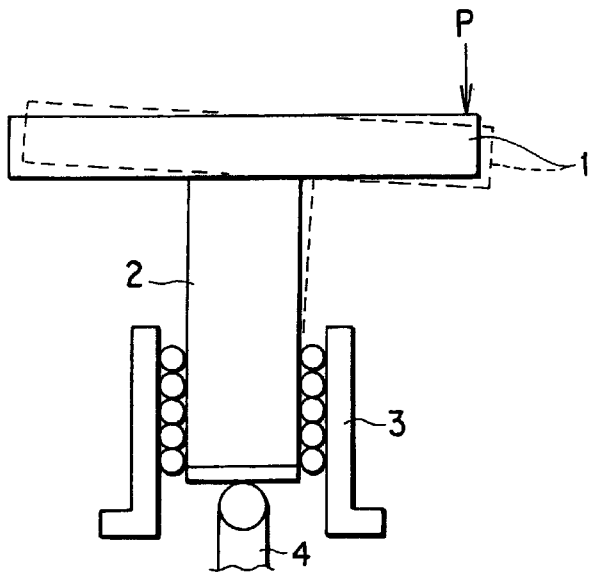
FIG. 5 is a diagrammatic illustration showing how the inspection apparatus of the probe apparatus slants.
Figure 6:
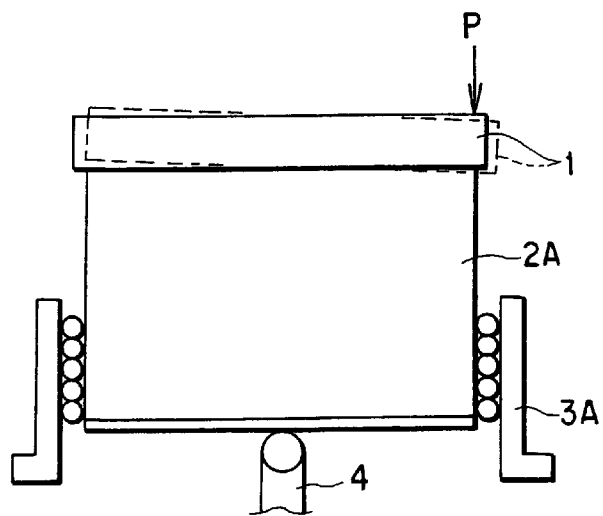
FIG. 6 is a diagrammatic illustration showing how the inspection apparatus of another probe apparatus slants.
Figure 7:
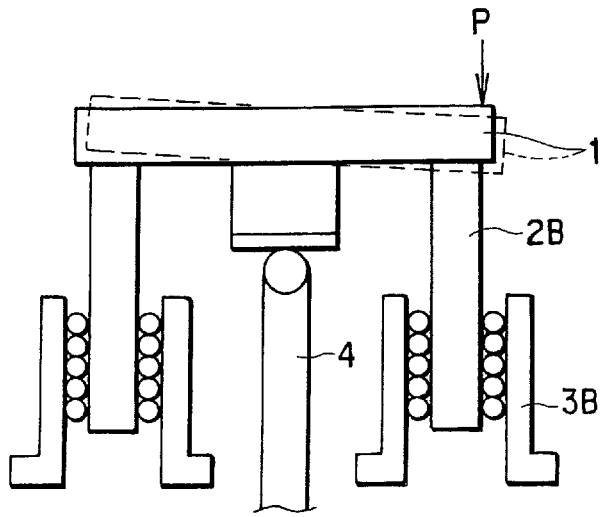
FIG. 7 is a diagrammatic illustration showing how the inspection apparatus of still another probe apparatus slants.

A support table lift mechanism 25 is provided at each of the three corners of the Z base 20 (i.e., portions located on the outer side of the chuck top 21). The support table lift mechanism 25 is made up of Z shafts 25A for supporting the support table, and Z shaft lifting mechanisms 25B and 25C. The Z shaft 25A can be moved in the vertical direction by the lifting mechanisms 25B and 25C, and the Z base 20 can therefore be moved in the vertically direction while maintaining a horizontal posture. The Z shaft 25A of the support table lift mechanism 25 extends downward from the corresponding corner of the Z base 20. In FIG. 3B, the Z shaft lifting mechanism 25B are made of the Z shaft 25A, a Z-shaft guide 25F, a motor 25C, an encorder 32, a nut 25D a ball screw 25E, bearings 35, for example (FIG. 3B). The Z-shaft guide is coupled to the Z shaft 25A. On the other hand, z shaft lifting mechanism (a motor) 25C vertically moves the Z shaft 25A through the Z-shaft guide 25F. For example, lifting mechanism 25C may be a reversible motor for moving the Z shaft 25A upward and downward. The support table lift mechanisms 25, which are three in number, are located on the outer sides of the chuck top 21, and serve to distribute the load exerted from the chuck top 21. By this load distribution, each support table lift mechanism 25 is not applied with a heavy load.

As shown in FIG. 2, a support table position detection mechanism 26, which operates with a vertical position control apparatus 31, is provided at each of the three corners of the Z base 20. As this support table position detection mechanism 26, it is possible to use a variety of means, including a linear sensor, a laser displacement meter, etc. In the description below, reference will be made to the case where the support table position detection mechanism 26 is made of a linear sensor.

The linear sensor 26 senses the position of the corresponding Z shaft. On the basis of that position, the support table lift mechanism 25 is driven. In this manner, the Z shafts are individually controlled in vertical movement, and the Z base 20 is thereby controlled to be horizontal. The linear sensor 26 will be described with reference to the diagrammatic illustration shown in FIG. 3A. As shown in FIG. 3A, the linear sensor 26 may comprises a linear scale section 26A which is provided on the X stage 19 and located adjacent to the support table lift mechanism 25, and a linear encoder section 26B for reading the graduation of the linear scale section 26A. The linear encoder section 26B extends downward form the Z base 20. The vertical position control apparatus 31 compares a value detected by the linear sensor 26 with a predetermined target position (which is determined as being the sum of the height of the inspection pins of the probe card and the overdrive amount of the Z base). The motor 25C of the support table lift mechanism 25 is controlled in accordance with the difference between the detected value and the target position, thereby controlling the vertical position of the Z base 20. Even when the load exerted in the overdrive mode causes the Z shaft 25A of the support table lift mechanism 25 to sink in the Z shaft guide 25B, this sinking-in distance (for which the Z shaft descends more than necessary) is detected by the linear sensor 26. The motor 25C is driven, accordingly, and the Z base is moved up by the distance corresponding to the sinking-in distance. As a result, an adequate overdrive amount is ensured, as well as reliable electric contact between a wafer and all probes.

The linear sensor 26 described can be replaced with a rotary encoder, and this rotary encoder can be used for position control. In this case, the rotary encoder is provided for each of the Z shaft lifting mechanisms. It should be noted that the rotary encoder can detect the moving distance of the Z shaft 25A, but cannot detect the level of the Z base 20 with reference to the level of the X stage 19. This being so, if the Z shaft sinks in, the position (or level) of the Z base 20 cannot be detected with accuracy. One measure that can be taken to solve this problem is to provide a load sensor 33 (ex. Load Cell) between the Z base 20 and the Z shaft 25A on the support table lift mechanisms 25. With the load sensor, it is possible to acquire data on the pin-point load applied to each support table lift mechanism 25 and data on the displacement. On the basis the data acquired in this manner, the sink-in amount at each portion of the chuck top 21 can be calculated, and positional correction can be performed in accordance with the calculated values. According to this technology, the position of the Z base 20 can be detected within an error of several $\mu$m.

Figure 4:
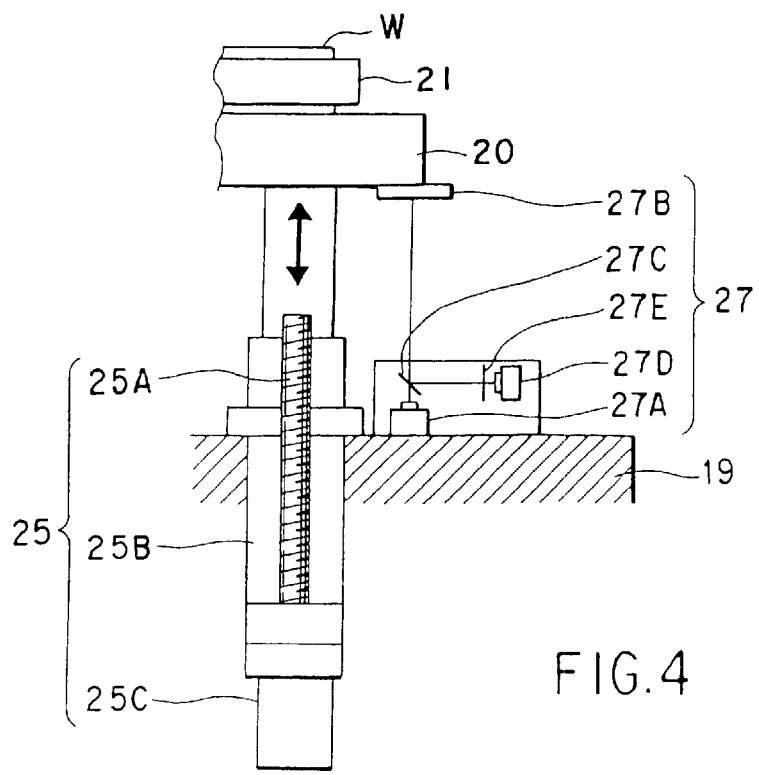
FIG. 4 is a diagrammatic illustration of a slant detection mechanism for the inspection stage shown in FIG. 2.

As shown in FIGS. 2 and 4, a slant detection mechanism 27 is provided in the neighborhood of one Z shaft lift mechanism 25, so as to detect a slant of the Z base 20. The slant detection mechanism 27 detects an abnormal slant of the Z base 20, so that an excessive load is prevented from being applied to the Z shaft guide 25F. The slant detection mechanism 27 can be realized in a variety of methods. One of the major methods is to detect the slant of the Z base itself, and another is to detect a lean of the Z shaft. In the description below, reference will be made to a mechanism for detecting the slant of the Z base. An optical detection mechanism can be adopted as this slant detection mechanism. The optical detection mechanism may comprise a light-emitting element 27A provided on the X stage 19; a mirror 27B provided on the Z base 20 and facing the light-emitting element 27A; a half mirror 27C located between the mirror 27B and the light-emitting element 27A and inclined at an angle of 45°; a light-receiving sensor 27D located on one side of the half mirror 27C; and a diaphragm 27E located immediately in front of the light-receiving sensor 27E. A light beam emitted from the light-emitting element 27A passes through the half mirror 27C and is then reflected by the mirror 27B. The reflected light beam is reflected by the half mirror 27C and passes through the diaphragm 27E. Then, the light beam is detected by the light-receiving sensor 27D. The slant detection mechanism 27 can detect a slant of the Z base 20 unless the slant exceeds 0.5°. If the slant exceeds this angle, then the light-receiving sensor 27D cannot receive any light beams. In other words, the occurrence of an abnormal slant can be checked by detecting whether or not a light beam falls on the light-receiving sensor 27D. The slant detection mechanism may be realized by a planar sensor made of a CCD. A slant of the support plate can be automatically corrected in accordance with information detected by the planar sensor.

A description will now be given as to how the apparatus of the above embodiment operates. Inside the loader chamber 11, one wafer W is taken out of the carrier C by means of the tweezers 13. The wafer W is conveyed to the pre-alignment mechanism, by which it is pre-aligned with reference to an orientation flat. Then, the wafer W is transferred to the prober chamber 12, where it is placed on the chuck top 21.

The inspection stage 14 of the prober chamber 12 cooperates with the alignment mechanism. The X and Y stages 17 and 19 are moved in the X and Y directions, respectively, and the chuck top 21 is rotated in the θ direction, thereby aligning the wafer W and the probe card with each other. After this alignment, the wafer W is index-fed, so as to inspect the electric characteristics of the IC chips on the wafer W.

At the time of inspection, the motors 25C of the support table lift mechanism 25 arranged at three positions are driven, and the Z shafts 25A move up along the Z shaft guides 25B until the wafer W is brought into contact with the probes of the probe card. If the Z shafts 25A are further moved up by the motor, the wafer W is overdriven. As a result, the wafer W is applied with a heavy pin-point load.

According to the present embodiment, the Z base 20 is supported at three points located outside of the chuck top 21 and is vertically movable. Even if a pin-point load is applied to the wafer W, the Z base 20 (chuck top 21) is little slanted in comparison with the prior art. In addition, since the pin-point load is distributed to the three support table lift mechanisms 25, the load exerted to one support table lift mechanism is light, accordingly, and the load applied from the Z shaft 25A to the Z shaft guide 25F is also light.

If a given one of the Z shaft guides 25B is exerted with a heavier offset load than that of the others, the Z shaft 25A corresponding to that given one sinks greatly, resulting in a slant of the Z base.

According to the embodiment of the present invention, the linear sensors 26 monitor the vertical positions of the three support table lift mechanisms 25, control the position of the Z base 20, and maintain the horizontality thereof. To be more specific, when the Z shafts 25A of the support table lift mechanisms 25 sink in from the target positions, the sinking-in amount or distance is detected by the linear sensors 26. On the basis of the detected distance, the motors 25C are automatically driven, so as to raise the Z shafts 25A by the distances they sank in. As a result, the Z base 20 (chuck top 21) is lifted to the original inspection position. Since the required overdrive amount is ensured, the wafer W and the probes of the probe card are brought into reliable electric contact with each other. Even if an offset load is applied, and the Z shafts 25A of the three support table lift mechanisms 25 sink in for different distances, the support table lift mechanisms 25 are controlled in position in accordance with the sinking-in distances detected by the linear sensors 26. As a result, the Z base 20 is raised to the intended inspection position. As a result, the required overdrive amount is ensured, and the wafer W and the probes of the probe card are brought into reliable electric contact with each other. Hence, the inspection is very reliable.

If, for some reason or other, the Z shaft 25A of one of the support table lift mechanism 25 sinks in extremely, the Z base 20 may slant at an angle exceeding 0.5°. If this happens, this state is detected by the slant detection mechanism 27, and a notification of the state is made. Damage to the Z shaft guide 25F of the support table lift mechanism 25 is thus prevented.

As described above, according to the present embodiment, three support table lift mechanisms 25 are provided for the Z base 20, and the Z base 20 is supported by them at positions outward of the chuck top 21 and set to be vertically movable. With this structure, the wafer W is not applied with an offset load, and the chuck top 21 is remarkably prevented from slanting. In addition, since the pin-point load is distributed to the three support table lift mechanism 25, the load exerted to one support table lift mechanism is light, and the load applied from each Z shaft 25A to the corresponding Z shaft guide 25F is also light. The support table lift mechanism can therefore be formed of a material that is not very rigid.

According to the present embodiment, the linear sensor 26, used for controlling the vertical position of the Z base 20, is provided for each support table lift mechanism 25. With this structure, the position control can be performed in accordance with the sinking-in amount of each support table lift mechanism, and the wafer W and the probe card can be brought into contact with each other in a stable manner. It is therefore possible to execute a very reliable inspection.

According to the embodiment, the slant detection mechanism 27 is provided to detect the degree of horizontality of the Z base 20. If one of the Z shafts is exerted with an abnormal load, and the Z base 20 is slanted, the slant detection mechanism 27 issues a notification of the abnormal slant of the Z base 20. Thus, the support table lift mechanism incorporating the Z shaft exerted with the abnormal load is protected from damage.

The present invention is not limited to the embodiment described above, and the structural elements of the above embodiment can be modified or replaced with others in accordance with the need. The inspection stage described above is not applicable only to a probe apparatus. It can be employed as a stage used in various types of inspection apparatus for inspecting an object applied with a load, such as an inspection apparatus for inspecting IC chips formed on a semiconductor wafer, and an inspection apparatus for inspecting a liquid crystal device).

The present invention reliably prevents a slant of the chuck top (mount table) even if a probe card has a large number of pins or if a number of different probe cards are used. It is therefore possible to provide an inspection stage and an inspection apparatus that ensure inspection reliability.

According to the present invention, the means for controlling the vertical position of the support table is provided for the vertical driving mechanism. The present invention can therefore provide an inspection stage and an inspection apparatus which enable the position of the Z base to be controlled in accordance with sinking-in distances of the Z shaft even if these sinking-in distances are not uniform due to an offload exerted during inspection, and which can therefore keep the support table in the horizontal state at all times.

According to the present invention, the degree of horizontality of the support table is detected. The present invention can therefore provide an inspection stage and an inspection apparatus which can detect the Z base being slanted due to the offset load exerted during inspection, and which therefore prevent damage to the support table lift mechanism.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inspection stage comprising:
   a main chuck on which an object to be examined is mounted;
   a support table for supporting the main chuck;
   a support table lift mechanism including a plurality of z shafts for supporting the support table, and a z shaft vertical drive mechanism for vertically driving the z shafts individually;
   an X stage on which the support table lift mechanism is mounted and which is movable in an X direction; and
   a Y stage which supports the X stage and being movable in a Y direction.

2. An inspection stage according to claim 1, wherein said support table lift mechanism includes a vertical position control device for controlling vertical positions of the Z shafts individually.

3. An inspection stage according to claim 2, wherein said vertical position control device includes a slant detection mechanism for detecting a degree of horizontality of the support table
   said vertical position control device controlling the vertical positions of the Z shafts on the basis of the degree of horizontality of the support table detected by the slant detection means, so as to keep the degree of horizontality of the support table within a predetermined range.

4. An inspection stage according to claim 1, wherein said support table lift mechanism is located on an outer side of the main chuck.

5. An inspection apparatus comprising:
   a loader chamber in which a plurality of objects to be examined are received;
   a prober chamber for inspecting the objects fed from the loader chamber; and
   an inspection stage arranged inside the prober chamber,
   said inspecting stage including:
   a main chuck on which an object to be examined is mounted;
   a support table for supporting the main chuck;
   a support table lift mechanism including a plurality of z shafts for supporting the support table, and a z shaft vertical drive mechanism for vertically driving the z shaft individually;
   an X stage on which the support table lift mechanism is mounted and which is movable in an X direction; and
   a Y stage which supports the X stage and being movable in a Y direction.

6. An inspection stage according to claim 5, wherein said support table lift mechanism includes a vertical position control device for controlling vertical positions of the Z shafts individually.

7. An inspection stage according to claim 6, wherein said vertical position control device includes a slant detection mechanism for detecting a degree of horizontality of the support table
   said vertical position control device controlling the vertical positions of the Z shafts on the basis of the degree of horizontality of the support table detected by the slant detection means, so as to keep the degree of horizontality of the support table within a predetermined range.

8. An inspection stage comprising:
   a main chuck on which an object to be examined is mounted;
   a support table for supporting the main chuck;
   a support table lift mechanism including three z shafts for supporting the support table, a z shaft vertical drive mechanism for vertically driving each of the z shafts individually, and a vertical position control device for controlling the vertical position of each z shaft, said vertical position control device having a linear sensor for detecting a position of the support table, and another linear sensor for detecting the degree of horizontality of the support table;
   an X stage on which the support table lift mechanism is mounted and which is movable in an X direction; and
   a Y stage which supports the X stage and being movable in a Y direction.

9. An inspection stage comprising:
   a main chuck on which an object to be examined is mounted;
   a support table to support the main chuck;
   a support table lift mechanism including a plurality of z shafts which support the support table, and a plurality of z shaft vertical drive mechanisms which are provided for the z shafts, respectively, and vertically drive the z shafts independently of one another;
   an X stage on which the support table lift mechanism is mounted and which is movable in an X direction; and
   a Y stage which supports the X stage and being movable in a Y direction.

10. An inspection apparatus comprising:
    a loader chamber in which a plurality of objects to be examined are received;
    a prober chamber to inspect the objects fed from the loader chamber; and
    an inspection stage arranged inside the prober chamber,
    said inspection stage including:
    a main chuck on which an object to be examined is mounted;
    a support table to support the main chuck;
    a support table lift mechanism including a plurality of z shafts which support the support table, and a plurality of z shaft vertical drive mechanisms which are provided for the z shafts, respectively, and vertically drive the z shafts independently of one another;
    an X stage on which the support table lift mechanism is mounted and which is movable in an X direction; and
    a Y stage which supports the X stage and being movable in a Y direction.

11. An inspection stage comprising:
    a main chuck on which an object to be examined is mounted;
    a support table to support the main chuck;
    a support table lift mechanism including three z shafts which support the support table, three z shaft vertical drive mechanisms which are provided for the z shafts, respectively, and vertically drive the z shafts independently of one another, and a vertical position control device which controls vertical positions of the z shafts, said vertical position control device including a linear sensor which detects a position of the support table, and another linear sensor which detects a degree of horizontality of the support table;
    an X stage on which the support table lift mechanism is mounted and which is movable in an X direction; and
    a Y stage which supports the X stage and being movable in a Y direction.

* * * * *